(12) United States Patent
Kanuri et al.

(10) Patent No.: US 7,547,621 B2
(45) Date of Patent: Jun. 16, 2009

(54) LPCVD GATE HARD MASK

(75) Inventors: Rajesh Kanuri, Santa Clara, CA (US); Chorng-Ping Chang, Saratoga, CA (US); Christopher Dennis Bencher, San Jose, CA (US); Hoiman Hung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 11/492,316

(22) Filed: Jul. 25, 2006

(65) Prior Publication Data

US 2008/0026584 A1 Jan. 31, 2008

(51) Int. Cl.
*H01L 21/20* (2006.01)

(52) U.S. Cl. .................. 438/585; 438/584; 438/706; 438/711; 438/723; 438/724; 257/E21.197; 257/E21.206; 257/E21.208; 257/E21.257; 257/E21.267

(58) Field of Classification Search ............. 438/689, 438/641, 584, 585, 589, 706, 711, 723, 724, 438/738, 757; 257/E21.171, E21.197, 206, 257/208, 257, 267, 268, 293, 577
See application file for complete search history.

(56) References Cited

U.S. PATENT DOCUMENTS

| | | | |
|---|---|---|---|
| 6,033,998 A * | 3/2000 | Aronowitz et al. | 438/786 |
| 6,087,229 A * | 7/2000 | Aronowitz et al. | 438/287 |
| 6,211,045 B1 * | 4/2001 | Liang et al. | 438/585 |
| 6,242,309 B1 | 6/2001 | Lee | |
| 6,534,352 B1 | 3/2003 | Kim | |
| 6,541,401 B1 | 4/2003 | Herner et al. | |
| 6,680,258 B1 * | 1/2004 | Tsai et al. | 438/706 |
| 6,818,537 B2 | 11/2004 | Cheong | |
| 6,940,129 B2 | 9/2005 | Kim et al. | |
| 7,186,662 B2 * | 3/2007 | Chen et al. | 438/738 |
| 2003/0203556 A1 * | 10/2003 | Segawa | 438/200 |
| 2004/0053468 A1 * | 3/2004 | Dong et al. | 438/261 |
| 2005/0064684 A1 * | 3/2005 | Todd et al. | 438/478 |
| 2005/0247986 A1 | 11/2005 | Ko et al. | |
| 2005/0287801 A1 | 12/2005 | Jin | |
| 2006/0205224 A1 * | 9/2006 | Huang et al. | 438/725 |

* cited by examiner

*Primary Examiner*—Michael S Lebentritt
(74) *Attorney, Agent, or Firm*—Patterson & Sheridan, LLP

(57) ABSTRACT

A gate hard mask is deposited on a gate structure using low pressure chemical vapor deposition (LPCVD). By doing so, the wet etch removal ratio (WERR) of the gate hard mask relative to the underlying polysilicon gate layer is increased when compared to prior art hard masks. The LPCVD gate hard mask will not only etch faster than prior art hard masks, but it will also reduce undercutting of the gate oxide. To provide additional control of the wet etch rate, the LPCVD hard mask can be annealed. The annealing can be tailored to achieve the desired etching rate.

14 Claims, 2 Drawing Sheets

LPCVD GATE HARD MASK

BACKGROUND OF THE INVENTION

1. Field of the Invention

Embodiments of the present invention generally relate to a method of depositing a gate hard mask for a gate structure and computer readable programs executable to perform the method.

2. Description of the Related Art

When forming a gate structure, a gate oxide layer 2 is deposited on a substrate 1 followed by a polysilicon gate layer 3. FIG. 1A shows an exemplary prior art gate structure 5 before any etching. The polysilicon gate layer 3 and the gate oxide layer 2 need to be etched, so a gate hard mask 4 is formed over the polysilicon gate layer 3. The gate hard mask 4 is formed by plasma enhanced chemical vapor deposition (PECVD). The polysilicon gate layer 3 and gate oxide layer 2 are then plasma etched (i.e. dry etched). Next, the remaining gate hard mask 4 must be removed. A good removal process is to use an etching solution (i.e. wet etch). Unfortunately, while the wet etch is good at removing the gate hard mask 4 layer, it is also good at removing the gate oxide layer 2. As can be seen from FIG. 1B, the wet etch removes the gate hard mask 4, but it also creates an undesirable undercut 8 in the gate oxide layer 2. The wet etch removal ratio (WERR), which is defined as the wet etch removal rate of one material divided by the wet etch removal rate of another material, for a PECVD gate hard mask 4 relative to the gate oxide 2 is typically 3 to 4.

Accordingly, there is a need in the art to provide a gate hard mask effective for dry etching the polysilicon gate layer and gate oxide layer and also have a high WERR to prevent undesirable undercutting of the gate oxide layer.

SUMMARY OF THE INVENTION

The present invention generally provides a method of depositing a gate hard mask on a gate structure using low pressure chemical vapor deposition (LPCVD) and a computer readable program for performing the method. The WERR of the gate hard mask deposited using LPCVD relative to a polysilicon gate layer is higher than in the prior art. As a result, the LPCVD gate hard mask will etch faster than prior art hard masks, and thereby reduce undercutting of the gate oxide. To provide additional control of the wet etch rate, the LPCVD hard mask can be annealed. The annealing can be tailored to achieve the desired etching rate.

According to an embodiment of the present invention, a method of depositing a gate hard mask for a gate structure includes depositing a gate hard mask over a polysilicon gate layer by LPCVD.

The method may be carried out in a process chamber at a temperature of about 685° C. to about 715° C. and at a pressure of about 200 Torr. The method may also include dry etching the polysilicon gate layer and wet etching the gate hard mask to remove the gate hard mask.

According to another embodiment of the present invention, a method for forming a gate structure on a substrate disposed in a chamber includes controlling the chamber temperature to about 700° C., controlling the chamber pressure to about 200 Torr, controlling the flow of various gases into the chamber for a gate hard mask to be formed by LPCVD, and controlling the flow of various gases into the chamber for the gate hard mask to be etched.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method of forming a gate hard mask for a gate structure and a computer readable program to perform the method. An exemplary apparatus in which to perform the process is a Centura® SiNgene® Plus LPCVD supplied by Applied Materials, Inc., Santa Clara, Calif.

Initially, a wafer substrate 1 is provided. The substrate 1 can be any conventional semiconductor material such as silicon, silicon germanium, etc. Upon the substrate 1, a gate oxide layer 2 is formed. The gate oxide layer 2 can be thermally grown using dry oxidation in a rapid thermal oxidation chamber. The gate oxide layer 2 typically will have a thickness of about 1.5 nm. The gate oxide layer 2 can be any conventional gate oxide such as silicon oxide.

After forming the gate oxide layer 2, a polysilicon gate layer 3 is formed. The polysilicon gate layer 3 can be deposited by any conventional method for depositing polysilicon in a gate structure 6. For example, the polysilicon gate layer 3 may be deposited using a LPCVD in a chamber at 720° C. Another method involves using $SiH_4$ or $Si_2H_6$ based films. The polysilicon gate layer 3 could be a doped polysilicon gate layer. A conventional dopant for polysilicon in gate structures is phosphorus.

Figure 1A:
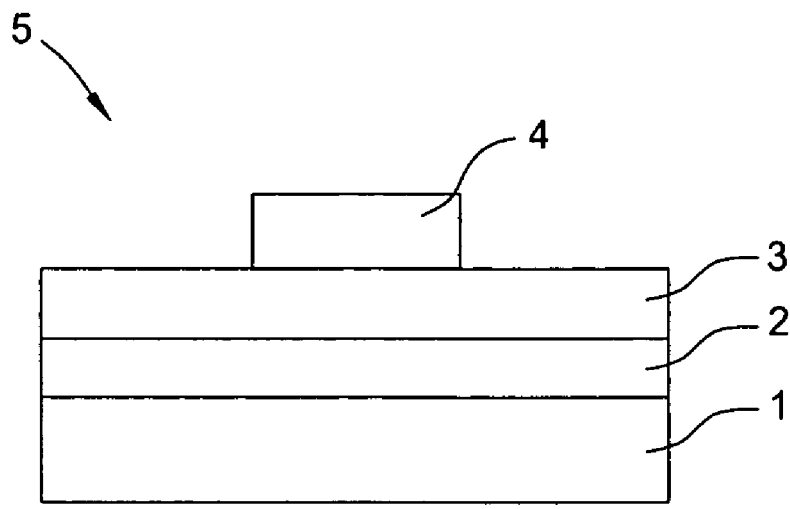
FIGS. 1A and 1B show a prior art gate structure formed using PECVD.
Figure 1B:
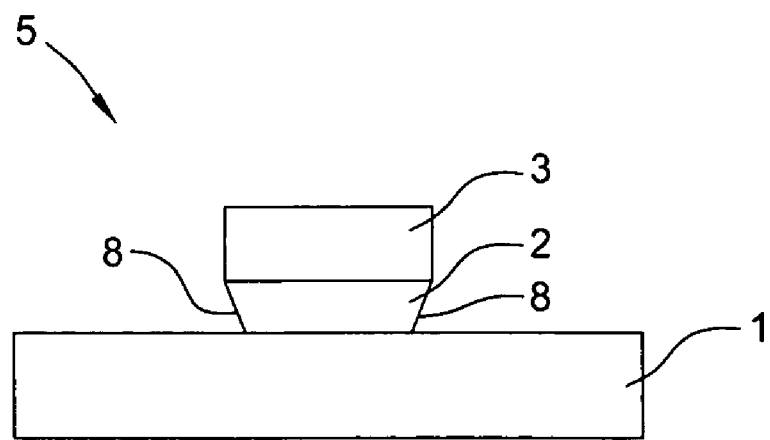
Figure 2A:
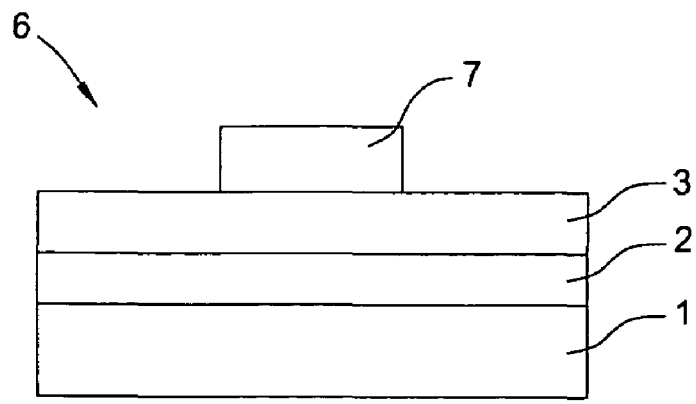
FIGS. 2A-2C show a gate structure formed using the method of the instant invention.

A gate hard mask 7 of silicon oxide is then deposited on the polysilicon gate layer 3. The gate hard mask 7 will serve as an etching mask when the polysilicon gate layer 3 and the gate oxide layer 2 are etched. FIG. 2A shows the gate structure 6 with the gate hard mask 7 before etching the polysilicon gate layer 3 and the gate oxide layer 2.

The gate hard mask 7 is formed by LPCVD. In this process, the chamber is heated up to about 700° C., and the pressure of the chamber is evacuated to about 200 Torr. The temperature can be in range of about 685° C. and about 715° C., but 700° C. is preferred. The pressure needs to be about 200 Torr because at higher pressures, nucleation will occur. The balance between the pressure and temperature is important because at the low temperature and low pressure, the reactive species will not have enough energy to react before they reach the surface. The low pressure and low temperature promote surface reactions, which are preferred.

After the chamber has been heated to about 700° C. and evacuated to about 200 Torr, $N_2$ and $N_2BP$ gases are supplied into the chamber at rates of about 10,000 sccm and about 7,000 sccm, respectively. The $N_2$ is provided to the chamber from the top. $N_2BP$ is a bottom purge of $N_2$ that flows from the bottom of the chamber. $N_2BP$ prevents unnecessary reaction and formation of hard to clean deposits within the chamber. The gate structure 6 with the substrate 1, gate oxide layer 2, and polysilicon gate layer 3 is then pretreated by supplying $N_2O$ gas into the chamber at a rate of about 3,000 sccm as the $N_2$ and $N_2BP$ gases are being supplied.

Subsequently, to deposit the gate hard mask layer 7, $SiH_4$ gas is delivered into the chamber at a rate of about 4.2 sccm while the $N_2O$, $N_2$, and $N_2BP$ gases are being supplied at rates of about 3,000 sccm, about 10,000 sccm, and about 7,000 sccm, respectively. Under these processing conditions, the gate hard mask 7 is deposited at a rate of about 2.2 Å/sec with very good uniformity to a thickness of about 450 Å. It is to be understood that the thickness of the gate hard mask 7 can be tailored to the desired application. For example, if the gate oxide layer 2 has a slow etching rate, the thickness of the gate hard mask 7 should correspondingly be thicker. On the other hand, if the gate oxide layer 2 is of a material that etches rather fast, the gate hard mask 7 should be thinner. In a similar fashion, the polysilicon gate layer 3 thickness will also be adjusted based upon the selection of the gate oxide layer 2.

Once the LPCVD gate hard mask 7 is formed, the gate hard mask 7 is then subjected to two separate post-treatments of $N_2O$ at a flow rate of about 3,000 sccm. While the $N_2O$ gas is being supplied, $N_2$ and $N_2BP$ gases are also supplied at flow rates of about 10,000 sccm and about 7,000 sccm, respectively. After each $N_2O$ post-treatment, the chamber is purged of the $N_2O$ gas. During the purge, the $N_2O$ is shut off while the $N_2$ and $N_2BP$ gases are reduced to about 7,000 sccm and about 3,000 sccm, respectively.

Figure 2B:
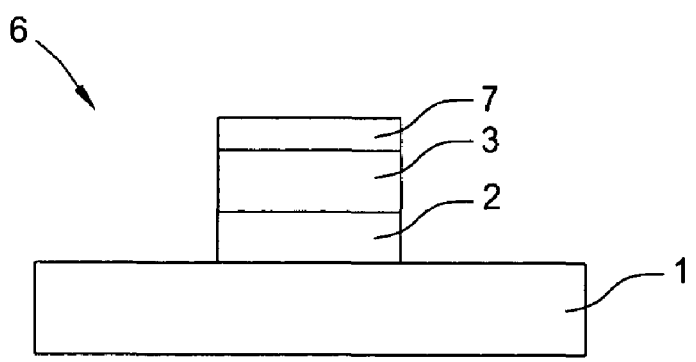

Using the LPCVD gate hard mask 7 as a mask, the polysilicon layer 3 and the gate oxide layer 2 are etched in a plasma environment (i.e. dry etch). During the dry etching, a portion of the gate hard mask 7 will etch as well. The LPCVD gate hard mask 7 will typically etch about 10% faster than the PECVD gate hard mask 4 in a plasma environment, and with a selectivity of between about 7:1 to about 8:1 between the polysilicon gate layer 3 and the LPCVD gate hard mask 7. For instance, when a 450 Å LPCVD gate hard mask 7 is used, a plasma etch to remove 150 nm of the polysilicon gate layer 3 will remove about 200 Å of LPCVD gate hard mask 7. FIG. 2B shows the resulting structure with the gate oxide layer 2, polysilicon gate layer 3, and the etched gate hard mask 7.

Following the dry etching step, the etched gate hard mask 7 is removed by a wet etching process. It is important to remove the etched gate hard mask 7 as quickly as possible to minimize any undercutting of the gate oxide.

Figure 2C:
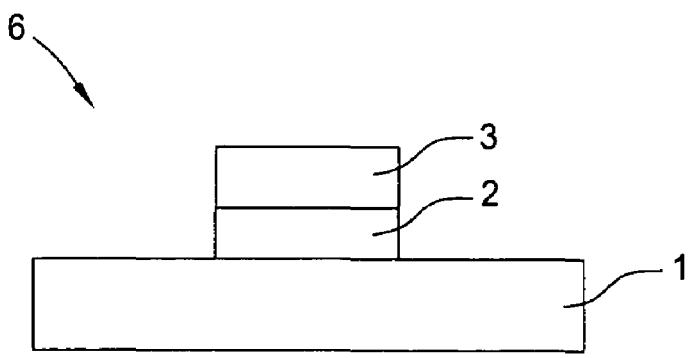

To that end, the LPCVD gate hard mask 7 is much more beneficial over the PECVD gate hard mask 4 of the prior art. The WERR of the PECVD gate hard mask 4 is about 3 to 4, but the WERR of the LPCVD gate hard mask 7 is about 7 to about 8. In other words, the LPCVD gate hard mask 7 of the instant invention will etch at a faster rate than the PECVD gate hard mask 4. The faster etching rate of the gate hard mask is desirable because it reduces the amount of undercutting that will occur in the gate oxide layer 2. FIG. 2C shows the resulting gate structure 6 after the LPCVD gate hard mask 7 has been completely removed by wet etching. As can be seen from the figure, there is little or no undercutting of the gate oxide layer 2. As device dimensions shrink, decreasing wet etching time is significant and can potentially enhance device performance.

Of course, it is sometimes beneficial to have an etching time longer than that of the LPCVD gate hard mask 7, but also faster than that of the PECVD gate hard mask 4. In such a situation, annealing can help. By annealing the LPCVD gate hard mask 7, the WERR can be lowered to a value between the WERR of the LPCVD hard mask and the WERR of the PECVD hard mask. The thermal budget (i.e. time and temperature for annealing) can be tailored to the specific needs of the process.

Processes of making gate structures and gate hard masks can be computer driven in accordance with a computer readable program containing instructions that control various components of the process chamber to perform the method steps discussed above.

It is to be understood that the gate oxide layer 2 may be formed by conventional deposition methods such as thermal oxidation, nitridation, sputter deposition, or chemical vapor deposition. The physical thickness of the gate oxide layer 2 may vary depending on the scaling design constraints, but is preferably in the range of 5 to 150 Angstroms. The gate oxide layer 2 may be formed of silicon oxide, silicon nitride, silicon oxynitride, a high-K dielectric, or combination thereof. When using a high permittivity (high-K) dielectric, preferably the dielectric constant is greater than about 8. The high-K dielectric may include transition metal oxides or rare earth oxides, for example including aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. The silicon oxide equivalent oxide thickness (EOT) of the gate dielectric is preferably less than about 50 Angstroms, more preferably less than about 20 Angstroms, and even more preferably less than about 15 Angstroms.

It is also to be understood that the polysilicon gate layer 3 may be formed of doped polysilicon, polysilicon-germanium, metals, metal silicides, metal nitrides, or conductive metal oxides. In a preferred embodiment, the polysilicon gate layer 3 is formed of doped polysilicon. Metals such as molybdenum, tungsten, titanium, tantalum, platinum, and hafnium may be used in an upper portion of the polysilicon gate layer 3. Metal nitrides may include, but are not limited to, molybdenum nitride, tungsten nitride, titanium nitride, and tantalum nitride. Conductive metal oxides may include, but are not limited to, ruthenium oxide and indium tin oxide.

It is also to be understood that a hard mask comprises masking materials such as silicon oxide, silicon oxynitride, silicon nitride, and other commonly used masking materials.

While the foregoing is directed to embodiments of the present invention, other and further embodiments of the invention may be devised without departing from the basic scope thereof, and the scope thereof is determined by the claims that follow.

The invention claimed is:

1. A method of forming a gate hard mask for a gate structure comprising:
    depositing a gate hard mask over a polysilicon gate layer by low pressure chemical vapor deposition, the gate hard mark selected from the group consisting of silicon oxide, silicon oxynitride, and silicon nitride;
    exposing the gate hard mask to $N_2O$ in a processing chamber;
    purging the processing chamber of $N_2O$;
    plasma etching the polysilicon gate layer using the gate hard mask as a mask; and then
    wet etching the gate hard mask to remove the gate hard mask.

2. The method as claimed in claim 1, further comprising pretreating said polysilicon gate layer with $N_2O$ prior to depositing said gate hard mask.

3. The method as claimed in claim 1, further comprising annealing said gate hard mask.

4. The method as claimed in claim 3, further comprising pretreating said polysilicon gate layer with $N_2O$ prior to depositing said gate hard mask.

5. The method as claimed in claim 1, wherein said wet etching etches the gate hard mask about 7 to 8 times faster than the polysilicon layer.

6. The method as claimed in claim 5, further comprising pretreating said polysilicon gate layer with $N_2O$ prior to depositing said gate hard mask.

7. The method as claimed in claim 5, further comprising annealing said gate hard mask.

8. The method as claimed in claim 1, wherein said gate hard mask is deposited in a process chamber at a temperature of about 700° C. and a pressure of about 200 Torr.

9. The method of claim 1, further comprising depositing a gate oxide layer over the polysilicon layer prior to depositing the gate hard mask.

10. The method of claim 9, wherein the gate oxide layer comprises a high permittivity dielectric material having a dielectric constant greater than about 8.

11. The method of claim 1, further comprising flowing $N_2$ and $N_2BP$ gases into the processing chamber simultaneous with the $N_2O$.

12. The method of claim 1, wherein the gate hard mask is deposited by introducing $SiH_4$, $N_2O$, $N_2$, and $N_2BP$ gases into the processing chamber.

13. The method of claim 12, further comprising pretreating the polysilicon with $N_2O$ prior to forming the gate hard mask.

14. The method of claim 13, further comprising flowing $N_2$ and $N_2BP$ gases into the processing chamber simultaneous with the $N_2O$.

* * * * *